United States Patent [19]

Sethi

[11] Patent Number: 5,780,889
[45] Date of Patent: Jul. 14, 1998

[54] GATE OVERLAP DRAIN SOURCE FLASH STRUCTURE

[75] Inventor: Rakesh B. Sethi, Campbell, Calif.

[73] Assignee: Cypress Semiconductor Corp., San Jose, Calif.

[21] Appl. No.: 562,183

[22] Filed: Nov. 22, 1995

[51] Int. Cl.⁶ .................... H01L 29/76; H01L 29/788
[52] U.S. Cl. .................... 257/316; 257/314; 257/315; 257/318; 257/321; 365/185
[58] Field of Search .................... 257/314, 315, 257/316, 318, 321; 365/185

[56] References Cited

U.S. PATENT DOCUMENTS

| | | | |
|---|---|---|---|
| 5,345,104 | 9/1994 | Prall et al. | 257/607 |
| 5,404,037 | 4/1995 | Manley | 257/318 |
| 5,440,158 | 8/1995 | Sung-Mu | 257/315 |
| 5,502,321 | 3/1996 | Matsushita | 257/316 |
| 5,506,431 | 4/1996 | Thomas | 368/185.15 |
| 5,541,130 | 7/1996 | Ogura et al. | 437/43 |

OTHER PUBLICATIONS

Tomiyuki Arakawa, Ryoichi Matsumoto, and Takahisa Hayashi–Tunnell Oxynitride Film Formation For Highly Reliable Flash Memory–Jun. 1996–p. 819–p. 824.

Yoshimitsu Yamauchi, Masanori Yoshimi, Sinuchi Sato, Hiroki Tabuchi, Nobuyuki Takenaka, Keizo Sakiyam–A New Cell Structure For Sub–Quarter Micron High Density Flash Memory–1995.

K.S. Kim, J.Y. Kim, J.W. Yoo, Y.B. Choi, M.K. Kim, B.Y. Nam, K.T. Park, S.T. Ahn, and O.H. Kwon–A Novel Dual String NOR (DuSNOR) Memory Cell Technology Scalable To The 256 Mbit And Gbit Flash Memories–1995–p.263–p. 266.

Katsutaka Kimura, Toshihiro Tanaka, Masataka Kato, Tetsuo Adachi, Keisuke Ogura, Hitoshi Kume–Programming and Program–Verification Methods For Low–Voltage Flash Memories Using A Sector Programming Scheme–Jul. 1995–pp. 832–837.

Kohji Kanamori, Yosiaki S. Hisamune, Taishi Kubota, Eiji Hasegawa, Akihiko Ishitani, Takeshi Okazawa–A High Capacitive Coupling Ratio (HiCR) Cell For Single 3V Power Supply Flash Memories–Jan. 1995–p. 122–p. 131.

Kohji Kanamori, Yosiaki S. Hisamune, Taishi Kubota, Yoshiyuki Suzuki, Masaru Tsukiji, Eiji Hasegawa, Akihiko Ishitani, Takeshi Okazawa–A High Capacitive Coupling Ratio (HiCR) Cell For Single 3 Volt Power Supply Flash Memories–Aug. 1994–p. 1296–p. 1302.

(List continued on next page.)

*Primary Examiner*—Valencia Wallace
*Attorney, Agent, or Firm*—Maiorana & Acosta, PC

[57] ABSTRACT

The presently preferred embodiment of the invention provides a memory structure that eliminates the thick gate associated with the offset of the FAMOS transistor and reduces the standard 225 angstrom offset to a 100 angstrom offset required for FN tunnelling. The 100 angstrom offset is realized uniformly underneath the entire area of the floating poly. The invention uses transistors each having a 100 angstrom offset to realize both erase and programming functions. The present invention realizes an erasing feature through an erase transistor and an ERL line. However, the programming of the cell will be realized through the programming transistor. As a result, a double poly flash cell will function like an EEPROM. This functioning eliminates the hot electron tunnelling required to program conventional double poly flash cells and results in a significant reduction in chip real estate. The reduction allows the present invention to be scaled to next generation architectures. By eliminating the need for hot electron programming, a lower source voltage can be implemented. FN tunnelling can be realized with very low currents, typically in the area of 10 nano amps, which can be generated from the internal power supply on a typical chip. Implementation of the present invention with present technology eliminates one masking step during fabrication.

13 Claims, 3 Drawing Sheets

OTHER PUBLICATIONS

Seiichi Aritome, Riichiro Shirota, Koji Sakui, Jujio Masuoka–Data Retension Characteristics of Flash Memory Cells After Write and Erase Cycling–Aug. 1994–p. 1287–p. 1295.

Yosiaki S. Hisamune, Kohji Kanamori, Taishi Kubota, Yoshiyuki Suzuki, Masaru Tsukiji, Eiji Hasegawa, Akihiko Ishitani, and Takeshi Okazawa–A High Capacitive–Coupling Ratio (HiCR) Cell For 3 V–Only 64 Mbit And Future Flash Memories–1993–p. 19–p. 22.

GATE OVERLAP DRAIN SOURCE FLASH STRUCTURE

FIELD OF THE INVENTION

The present invention relates to integrated circuit memory devices and, more particularly, to an electrically-erasable programmable read only memory (EEPROM) storage cell using FN tunnelling for both programming and erasing for use in a programmable logic array (PLA).

DISCUSSION OF PRIOR ART

More efficient utilization of device area in very large scale integration (VLSI) technology is a prominent objective in order to increase the density, and thus increase the number of memory cells on a semiconductor chip for reducing costs and increasing speed of operation. In particular, there has been much investigation into non-volatile memory devices (i.e., a type of memory device that retains stored data even after power to the device has been removed).

An electrically programmable ROM (EPROM) implements non-volatile storage of data using a storage transistor having a so-called floating gate. The floating gate is located between a control gate and a substrate, and (unlike the control gate) is not connected to a word, bit, or any other line; it "floats." The EPROM is programmed by having hot electrons injected into the floating gate to cause a substantial shift in the threshold voltage of the storage transistor. Under high gate and high drain voltages, electrons gain sufficient energy to jump the silicon-silicon dioxide energy barrier, penetrating the oxide and flowing to the floating gate, which is completely surrounded by oxide. The injected electrons cause a 5 to 10 volt increase in the threshold of the device, changing it from an ON to an OFF state when a nominal 5 volt read voltage is applied to the control gate. That is, if the floating gate holds electrons, it is negatively charged. The negative electric field developed by the floating gate counteracts the positive field applied on the control gate (assuming an NMOS device). Thus, an activated word line cannot generate a sufficiently strong field using the control gate to turn-on the transistor. This type of storage transistor is known in the art as a Floating gate Avalanche injection MOS (FAMOS) device.

It would be advantageous to eliminate the hot electron tunneling during the programming process. The prior art cell is typically reprogrammed through a Vgnd transistor and erases through a ERL transistor. To program a particular cell, the Vgnd line needs to be turned into a load line. This load line provides a high current path to create the hot electrons that are injected into the floating gate because of coupling.

Electrically-erasable programmable read only memory (EEPROM) devices have been developed to overcome, to some extent, the above-mentioned problem associated with the FAMOS structure used in EPROM devices during programming. The basic operation of a conventional FLOating-gate Tunnel Oxide (FLOTOX) EEPROM memory cell is well-known. In a FLOTOX cell, the tunnel oxide, which is generally less than 100 angstroms thick, is formed over a portion of the drain region. The FLOTOX cell is designed such that a large fraction of the applied voltage is coupled across the tunnel oxide. Programming the FLOTOX cell requires application of a gate field>about 107 v/cm such that Fowler-Nordheim tunnelling (FN tunnelling) of electrons through the tunnel oxide to the floating gate will occur. The FN tunnelling is a quantum-mechanical effect which allows electrons to pass through the energy barrier at the silicon-silicon dioxide interface. The energy required for the electrons to pass this barrier is much lower than the energy required for hot electron injection programming. Such an electric field is conventionally obtained by grounding both the source and the drain, and applying a high voltage Vpp to the control gate of the FLOTOX transistor. The tunnelled charge shifts the threshold voltage of the transistor.

Erasing the cell is achieved by grounding the control gate, floating the source and applying a high voltage to the drain. In this case, most of the applied voltage is coupled across the tunnel oxide, but the field is reversed, resulting in tunneling of electrons from the floating gate to the drain.

FIG. 1 shows a prior art EEPROM memory cell 10, which will be used to illustrate the shortcomings of the prior art. The memory cell 10 includes a memory transistor 12, a select gate 14, an erase transistor 16, an erase line ERL, a virtual ground line VGND and a program line PG.

The conventional memory cell 10 is reprogrammed through the memory transistor 12 and erased through the erase transistor 16. The memory transistor 12 acts as an EPROM transistor. A floating polygate is illustrated as a dotted line between the memory transistor 12 and the erase transistor 16. The EPROM transistor is designed structurally to work like an EPROM because there is a polygate, of approximately 225 angstroms, underneath the floating polygate. The memory transistor 12 is programmed through the hot electron method that is well known in the art. The memory cell 10 is representative of the prior art—it is a double poly design. In a typical prior art design, the memory transistor 12 is a FAMOS device. Operation of the memory cell 10 may be understood by those skilled in the art with reference to the following table:

TABLE 1

F26 SHRUNK CELL SCHEMATIC

|  | Vwl Wordline | Vpg | Ver | Vgnd | Rpt |
| --- | --- | --- | --- | --- | --- |
| program | vpp | vpp-vt | vpp-vt | vload | vss |
| erase | vss | vss | vpp-vt | vss | vss |
| read | vcc | 0-vcc | vcc-vt | 0--.5 | 0--2 |

The load line provides a high current path to create the hot electrons. Vwl refers to a voltage present on the word line of the memory cell 10.

Since the prior art requires hot electron tunnelling, a thicker dielectric material is required under the memory transistor 12. To manufacture this thicker dielectric requires a separate masking step during fabrication. This separate step both increases the complexity of the manufacturing process as well as consumes a larger amount of chip real estate.

Accordingly, there is a need to provide an improved memory structure suitable for use in a memory device, such as a flash memory device, that minimizes or eliminates the problems as set forth above.

SUMMARY OF THE INVENTION

The presently preferred embodiment of the invention provides a memory structure that eliminates the thick gate associated with the offset of the FAMOS transistor and reduces the standard 225 angstrom offset to a 100 angstrom offset required for FN tunnelling. The 100 angstrom offset is realized uniformly underneath the entire area of the floating poly. The invention uses transistors each having a 100 angstrom offset to realize both erase and programming functions. The present invention realizes an erasing feature through an erase transistor and an ERL line. However, the programming of the cell will be realized through the programming transistor. As a result, a double poly flash cell will function like an EEPROM. This functioning eliminates the hot electron tunnelling required to program conventional double poly flash cells and results in a significant reduction in chip real estate. The reduction allows the present invention to be scaled to next generation architectures. By eliminating the need for hot electron programming, a lower source voltage can be implemented. FN tunnelling can be realized with very low currents, typically in the area of 10 nano amps, which can be generated from the internal power supply on a typical chip. Implementation of the present invention with present technology eliminates one masking step during fabrication.

As a result of eliminating the hot electron tunnelling needed to program the device, the present invention eliminates the load line necessary in the hot electron programming technique. To avoid programming and erasing the cell at unspecified times, a voltage Vpt on the gate and a voltage Vcc minus Vt on the source or drain of the programming transistor is implemented. The FN tunnelling is accomplished without checking the cell structure prior to programming as required by the prior art. The present invention reduces the die size; provides double edge programming, which speeds the programming process and eliminates the tunnel mask and Gox1 step necessary in the prior art. The only tunnel oxide is under the floating poly. The tunnel oxide mask can be fully enclosed in the diffusion region. This avoids endurance and/or charge loss problem. The present invention operates with only 5 V input voltage using an ISP programming technique which allows 256 bit parallel programming and a lower test cost.

DETAILED DESCRIPTION OF THE PREFERRED EMBODIMENT

Figure 1:
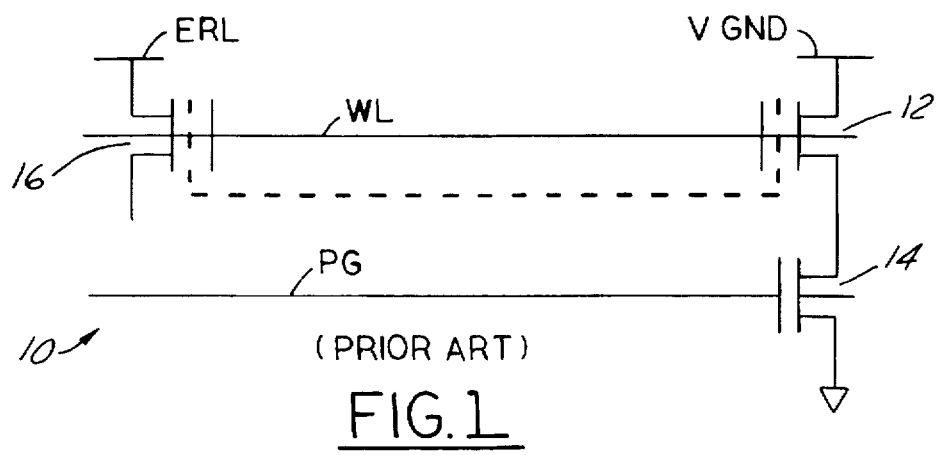
FIG. 1 is a circuit diagram illustrating a prior art single poly EEPROM cell.
Figure 2:
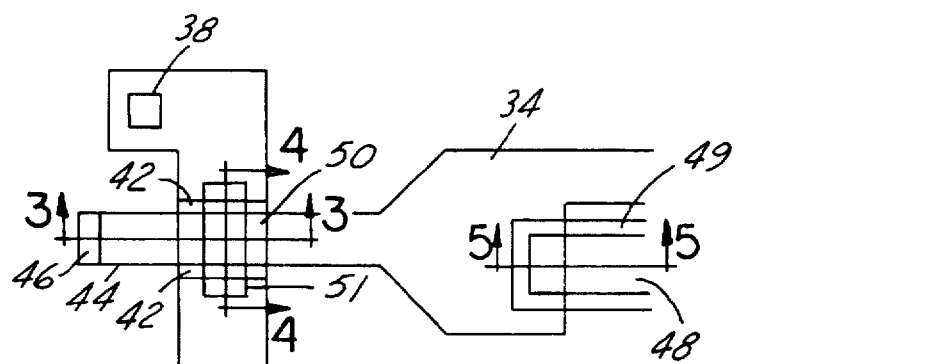
FIG. 2 is a top view of a memory cell of the presently preferred embodiment of the invention.

Referring initially to FIG. 2, a diagram illustrating a memory cell 30 of a presently preferred embodiment of the invention is shown. The memory cell 30 is provided for storing binary data having two possible states. The memory cell 30 is suitable for use in fast Programmable Logic Devices (PLD's) in the 5 ns range (2–5 ns) and other logic and memory parts, such as embedded memory parts. The memory cell 30 includes a diffusion area 32, a double poly stack 34, and a poly2 select gate 36. The diffusion area 32 includes a Vgnd contact 38, a RPT contact 40 and a source region 42. The Vgnd contact 38 represents a virtual ground for the memory cell 30. The double poly stack 34 comprises a floating poly 44, a poly2 control gate 46 and a erase node ERL 48. The double poly stack 34 crosses the diffusion area 32 forming the source region 42. The poly2 select gate 36 has a FAMOS programming region 50 that crosses the diffusion area 32. An erase mask 49 is formed around the erase node ERL 48.

Figure 3:
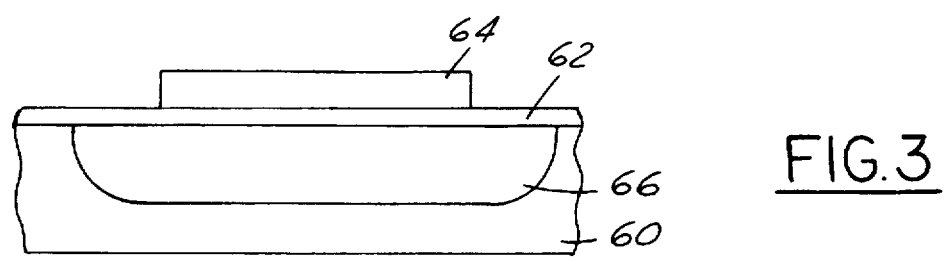
FIG. 3 is a simplified exaggerated cross-sectional view of a first processing step taken along section line A—A' of FIG. 2.

Referring to FIG. 3 a simplified exaggerated cross-sectional view taken along section line A—A' of FIG. 2 is shown illustrating a first step in the process of forming the FAMOS programming region 50. An erase mask 51 is formed around the programming region 50. FIG. 3 generally comprises a P-substrate 60, a tunnel oxide layer 62, a floating poly deposit 64, and a P-well 66. The tunnel oxide layer 62 is a substantially uniform layer about 90–110 angstroms thick, and preferably 100 angstroms thick to conform to FN tunnelling.

Figure 4:
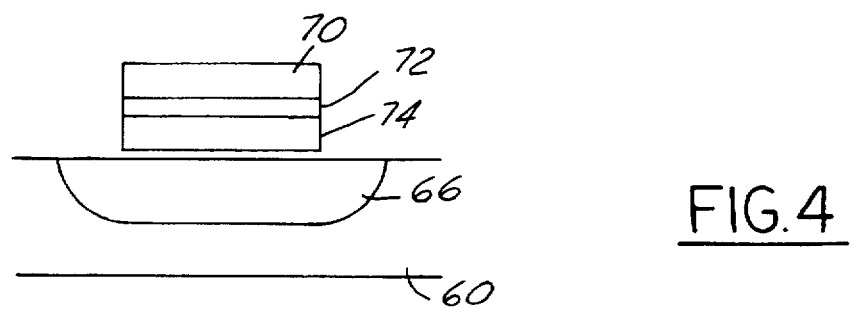
FIG. 4 is a simplified exaggerated cross-sectional view of a second processing step taken along section line A—A' of FIG. 2.

Referring to FIG. 4, the next step in the process of forming the FAMOS programming region 50 of FIG. 2 is shown. The floating poly deposit 64 of FIG. 3 is shown to include a poly2 diffusion layer 70 and a dielectric formulation ONO 72. The dielectric formulation ONO 72 is preferably a layer of dielectric material that is further disposed on the floating gate and may be any relatively high dielectric constant material, preferably a sandwich of oxide/nitride/oxide (ONO). FIG. 4 also includes a poly1 diffusion area 74. The P-substrate 60 and the P-well 66 remain the same as shown in FIG. 3.

Figure 5:
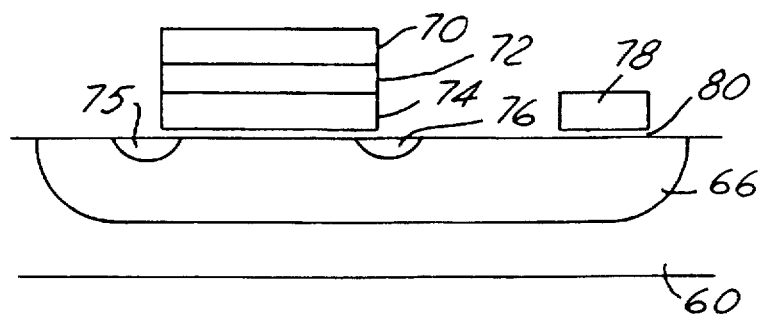
FIG. 5 is a simplified exaggerated cross-sectional view of a third processing step taken along section line A—A' of FIG. 2.

Referring to FIG. 5, the next step in the process of forming the FAMOS programming region 50 is shown. FIG. 5 includes a poly1 diffusion area 74, n+ regions 75, 76, a poly2 select gate 78 and a gate oxide layer 80. The gate oxide layer 80 is approximately 165 angstroms thick. The n+ region 75 and the n+ region 76 are the FAMOS source/drain regions along which the FN tunnelling programming occurs. The n+ regions 75 and 76 are preferably doped n+ such that they have a sheet resistance of about 20–40 ohms per square. Selection of an appropriate dopant and determining the magnitude of the dopant concentration to obtain this resistance value requires no more than a routine application of ordinary skill in the semiconductor fabrication field. It should also be appreciated by those of ordinary skill in the art that other N-species materials may be used in forming the n+ regions 75 and 76.

Figure 6:
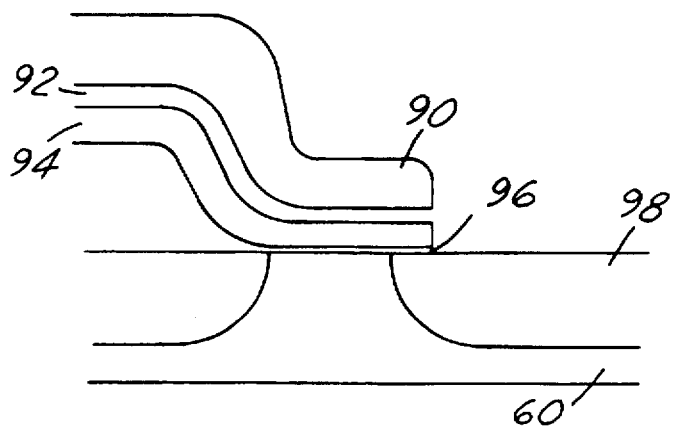
FIG. 6 is a simplified exaggerated cross-sectional view taken along section line B—B' of FIG. 2.

Referring to FIG. 6, a cross-section of the erase node 48 is shown along section line C–C' of FIG. 2. The erase node 48 generally comprises a poly2 region 90, an ONO region 92, a floating poly region 94, a tunnel oxide layer 96 and n+ region 98. The n+ region 98 is comprised of a material having similar characteristics to the n+ regions 75 and 76.

Figure 7:
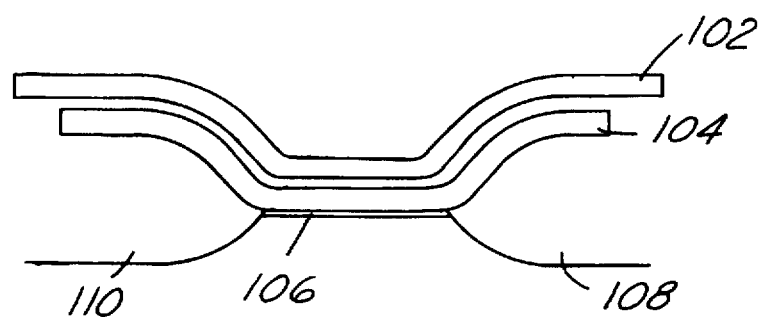
FIG. 7 is a simplified exaggerated cross-sectional view taken along section line B—B' of FIG. 2.

Referring to FIG. 7 a cross-section of the poly2 control gate 46 is shown along section line B–B' of FIG. 2. FIG. 7 generally comprises a control gate line 102, a FG line 104, a tunnel oxide layer 106, a field oxide layer 108 and a field oxide layer 110.

Referring to FIGS. 2–7, a description of the operation of the memory cell 30, will now be set forth in detail. The biasing conditions established is set forth in Table 2 will apply to the PROGRAM, ERASE, and READ modes of the operation of cell 30.

TABLE 2

| feature | rpt | vgnd | cg | pg | eg |
|---|---|---|---|---|---|
| selected cells on the common word line | 0 | 0 | vpp+ | vcc-vt | vpp-vt |
| unselected cells on the common word line | Vcc-Vt ~ Vpp/2 | Vcc-Vt ~ Vpp/2 | Vpp+ | Vcc | Vpp-vt |
| unselected cells on the same common product line | vcc-vt ~ Vpp/2 | vcc-vt ~ Vpp/2 | vcc | 0 | vcc-vt |
| erase | 0 | 0 | 0 | 0 | vpp-vt |
| read sel | 1-2 | 0 | vcc | vcc-vt | vcc-vt |

The rpt column represents the voltage realized at the rpt contact 40. The Vgnd column represents the voltage realized at the virtual ground Vgnd contact 38. The cg column represents the voltage realized at the control gate line 102. The pg column represents the voltage realized at the periphery gate. The eg column represents the voltage realized at the erase gate.

The P-substrate is realized using a twin well CMOS process as illustrated in Table 2, but can be extended to apply to triple well architectures as well. The cell Vt adjust mask is realized through Kooi oxide (sacrificial oxide) prior to depletion implant and adjusted to the erased cell threshold.

The memory cell 30 receives depletion implant in the depletion mask 49. After the implant resist strip is realized the tunnel oxide is grown followed by the floating poly depletion and definition. The ONO dielectric region 72 and 92 is grown and deposited followed by the periphery gate oxide, which is a 165 angstrom growth that is formed before the poly2 deposit is formed. The FAMOS source and drain junctions are implemented after the core poly mask etch defines the double poly stack.

Figure 8:
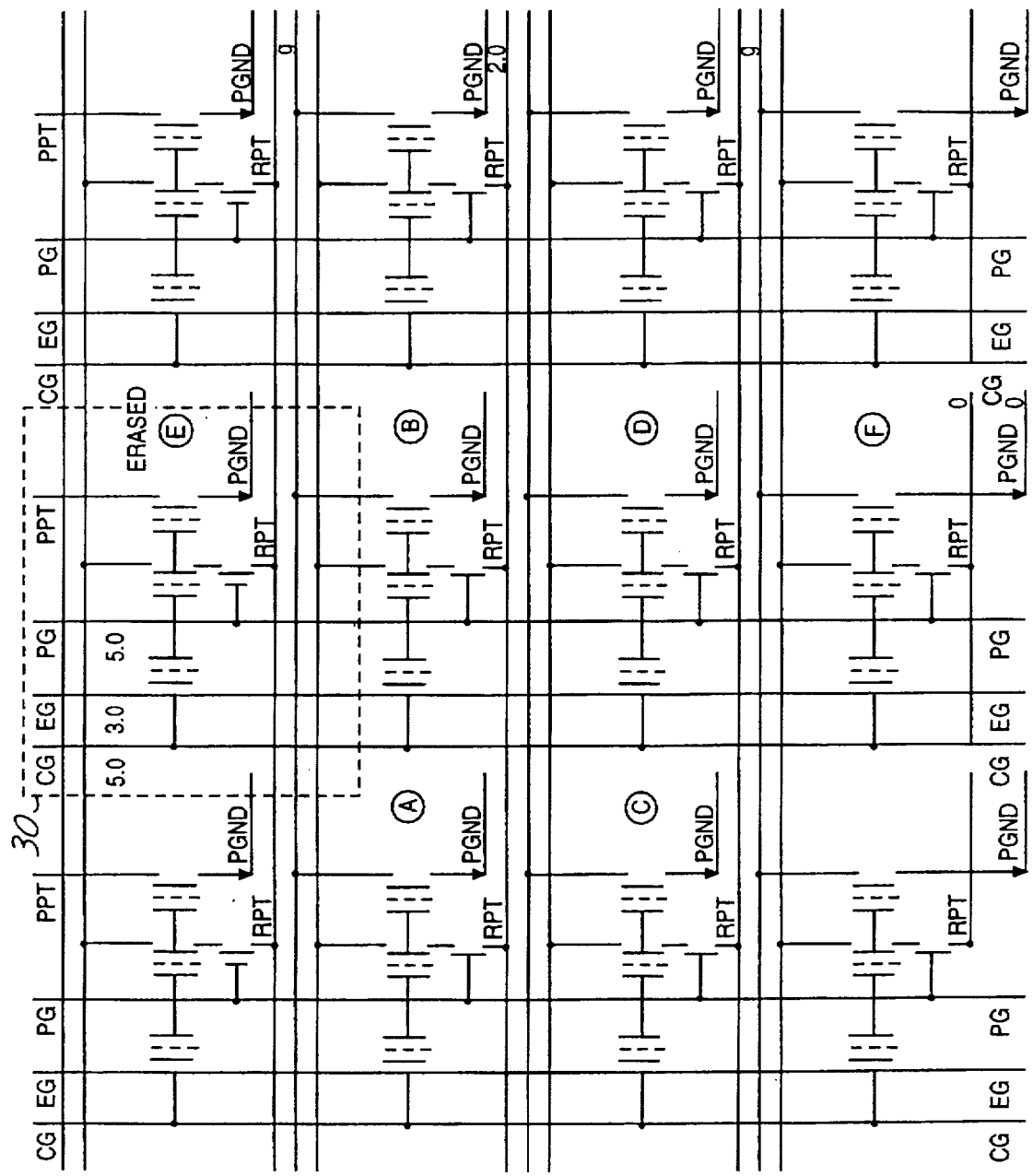
FIG. 8 is a diagram illustrating the implementation of the cell in a memory array.

Referring to FIG. 8, a memory array 120 implementing a variety of individual cells 30 is shown. FIG. 8 illustrates the advantage of reducing the chip real estate and implementing the memory cell 30 in the memory array 120.

It is to be understood that modifications to the inventions might occur to one with skill in the field of the invention within the scope of the appended claims.

I claim:

1. A non-volatile memory cell comprising:

a semiconductor substrate of a first conductivity type;

a source region having a second conductivity type opposite said first conductivity type in said substrate;

a drain region having said second conductivity type formed in said substrate;

a layer of a first dielectric material substantially uniform in thickness formed over said substrate, said layer of the first dielectric material extending substantially horizontally over at least a portion of said source region and said drain region, said first dielectric material layer permits FN tunneling programming of said memory cell;

a floating gate formed of a material of said first conductivity type overlapping each of said source region and said drain region and disposed on the layer of said first dielectric material;

a layer of a second dielectric material disposed on said floating gate; and a control gate formed of a material of said second conductivity type disposed on said layer of said second dielectric material.

2. The memory cell of claim 1 wherein the semiconductor substrate is P-type silicon, said drain region comprises a buried n+ region, and said source region is doped n-type.

3. The memory cell of claim 1 wherein said source region is doped with arsenic having a dopant concentration in the range of between about $10^{12}$ to about $10^{15}$ atoms per cubic centimeter.

4. The memory cell of claim 1 wherein said layer of said first dielectric material is silicon dioxide having a thickness of between about 90 and about 110 angstroms.

5. The memory cell of claim 4 wherein said floating gate has a sheet resistance of between about 80 and about 150 ohms per square.

6. The memory cell of claim 2 wherein said layer of said second dielectric material is a sandwich of oxide/nitride/oxide (ONO).

7. The memory cell of claim 2 wherein said control gate comprises a polycrystalline silicon material.

8. The memory cell of claim 6 wherein said control gate has a sheet resistance of between about 20 and about 40 ohms per square.

9. The memory cell of claim 1 wherein said substantially uniform layer is not thicker than 125 angstroms.

10. The structure of claim 1 further comprising an erase node comprising a layer of a third dielectric material formed over said substrate, said layer of the third dielectric layer having a thickness sufficiently thin such that FN tunnelling for erasing said memory cell can be carried out.

11. A non-volatile memory cell comprising:

a silicon substrate of p-conductivity type;

a source region of n-conductivity type;

a drain region of n+ conductivity type formed in said substrate;

a layer of a first dielectric material substantially uniform in thickness and not thicker than 125 angstroms formed over said substrate such that FN tunneling programming of said memory cell can be carried out, said layer of the first dielectric material extending substantially horizontally over at least a portion of said source region and said drain region;

a floating gate formed of a material of P—conductivity type extending over at least a portion of said source region and said drain region and disposed on the layer of said first dielectric material;

a layer of a second dielectric material disposed on said floating gate; and a control gate formed of a material of n-conductivity type disposed on said layer of said dielectric material.

12. The structure of claim 11 further comprising an erase node comprising a layer of a third dielectric material formed over said substrate, said layer of the third dielectric material having a thickness sufficiently thin such that FN tunnelling for erasing said memory cell can be carried out.

13. The structure of claim 1 wherein said dielectric material permits FN tunnelling erasing of said memory cell.

* * * * *